(12) United States Patent
Klug et al.

(10) Patent No.: US 6,837,939 B1
(45) Date of Patent: Jan. 4, 2005

(54) THERMAL PHYSICAL VAPOR DEPOSITION SOURCE USING PELLETS OF ORGANIC MATERIAL FOR MAKING OLED DISPLAYS

(75) Inventors: Justin H. Klug, Rochester, NY (US); Syamal K. Ghosh, Rochester, NY (US); Donn B. Carlton, Hamlin, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/624,311

(22) Filed: Jul. 22, 2003

(51) Int. Cl.[7] .............................................. C23C 14/00
(52) U.S. Cl. ........................ 118/726; 392/386; 392/389
(58) Field of Search ......................... 118/726; 392/386, 392/389

(56) References Cited

U.S. PATENT DOCUMENTS

| | | | |
|---|---|---|---|
| 2,447,789 A | * | 8/1948 | Barr ............................ 219/422 |
| 4,356,429 A | | 10/1982 | Tang |
| 4,539,507 A | | 9/1985 | VanSlyke et al. |
| 4,720,432 A | | 1/1988 | VanSlyke et al. |
| 4,769,292 A | | 9/1988 | Tang et al. |
| 5,532,102 A | * | 7/1996 | Soden et al. ................. 430/128 |
| 5,550,066 A | | 8/1996 | Tang et al. |
| 6,237,529 B1 | | 5/2001 | Spahn |
| 6,337,102 B1 | | 1/2002 | Forrest et al. |
| 2003/0015140 A1 | * | 1/2003 | Van Slyke et al. .... 118/723 VE |
| 2003/0054099 A1 | * | 3/2003 | Jurgensen et al. ........ 427/248.1 |
| 2003/0097989 A1 | * | 5/2003 | Shinde et al. ................ 118/726 |
| 2003/0101937 A1 | * | 6/2003 | Van Slyke et al. ........... 118/726 |
| 2003/0111014 A1 | * | 6/2003 | Donatucci et al. ........... 118/726 |
| 2003/0168013 A1 | * | 9/2003 | Freeman et al. ............. 118/726 |

* cited by examiner

Primary Examiner—Richard Bueker
(74) Attorney, Agent, or Firm—Raymond L. Owens (57) ABSTRACT

A thermal physical vapor deposition source for vaporizing compacted pellets of organic materials onto a surface of a substrate in forming a display, including a housing defining a plurality of spaced passages each for receiving compacted pellets, a cover plate over the housing, with a first plurality of openings corresponding to the spaced passages of the housing and an electrical heater structure disposed over the cover plate. The thermal physical vapor deposition source further including an aperture plate, disposed over the electrical heater structure, an electrically insulating spacer member located between the electrical heater structure and an aperture plate, and circuitry for applying current to the electrical heater structure to produce heat sufficient to vaporize the pellets and permit vapor efflux of materials to pass through the cover plate, the heater structure, the electrically insulating spacer member and the aperture plate, onto the substrate.

23 Claims, 4 Drawing Sheets

THERMAL PHYSICAL VAPOR DEPOSITION SOURCE USING PELLETS OF ORGANIC MATERIAL FOR MAKING OLED DISPLAYS

CROSS REFERENCE TO RELATED APPLICATIONS

Reference is made to commonly assigned U.S. patent application Ser. No. 10/352,558 filed Jan. 28, 2003, entitled "Method of Designing a Thermal Physical Vapor Deposition System" By Grace et al.; U.S. patent application Ser. No. 10/093,739 filed Mar. 8, 2002 entitled "Elongating Thermal Physical Vapor Deposition Source with Plural Apertures for Making an Organic Light-Emitting Device" by Freeman et al.; U.S. patent application Ser. No. 09/898,369 filed Jul. 3, 2001, entitled "Method of Handling Organic Material in Making An Organic Light-Emitting Device" by VanSlyke et al.; and U.S. patent application Ser. No. 10/073,690 filed Feb. 11, 2002, entitled "Using Organic Materials in Making An Organic Light-Emitting Device" by Ghosh et al., the teachings of which are incorporated herein.

FIELD OF THE INVENTION

The present invention relates to physical vapor deposition of organic material to form an organic layer, which will form part of an organic light-emitting display (OLED). More particularly, the present invention relates to using an improved vapor deposition physical vapor deposition source wherein pellets of compacted organic materials are used.

BACKGROUND OF THE INVENTION

An organic light-emitting device, also referred to as an organic electroluminescent device, can be constructed by sandwiching two or more organic layers between first and second electrodes.

In a passive matrix organic light-emitting device (OLED) of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ torr ($1.33 \times 10^{-1}$ pascal). In addition to doped or undoped organic light-emitting material, typical organic layers used in making OLED displays are doped or undoped organic hole-injecting material, doped or undoped organic hole-transporting material, and doped or undoped organic electron-transporting material, where doping refers to adding a minor constituent to enhance the electrical performance, optical performance, stability, or life time of a given material or device constructed thereof A plurality of laterally spaced cathodes is deposited as second electrodes over an uppermost one of the organic layers. The cathodes are oriented at an angle, typically at a right angle, with respect to the anodes.

Applying an electrical potential (also referred to as a drive voltage) operates such conventional passive matrix organic light-emitting devices between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device (OLED), an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in commonly-assigned U.S. Pat. Nos. 4,356,429; 4,539,507; 4,720,432, and 4,769,292, the disclosures of which are herein incorporated by reference.

Other kinds of imaging devices, such as imaging phosphors for computed radiography and x-ray photoconductive devices for digital radiography, depend on the ability to coat the active materials uniformly over large areas. While the following discussion pertains to OLED displays, it should be readily apparent that the same invention can be applied to the deposition of alkalihalide phosphors, amorphous semiconductors, and other luminescent or photoactive layers, as well as a variety of other materials used in devices based on such luminescence or photoactive layers.

For sufficiently small substrates, a point source approach can be implemented wherein the material to be deposited emanates from a localized heated crucible and the substrate is placed sufficiently far from the localized region of vaporization that the coating is sufficiently far from the localized region of vaporization that the coating is sufficiently uniform along the substrate. As substrate size increases or working distance increases, rotary or planetary motion of the substrate relative to the localized source is often required to produce the desired uniformity.

By elongating the vaporization source and providing for translation of source and substrate relative to one another, the desired uniformity can be attained at considerably smaller working distances and thus considerably higher rates and better materials utilization, if desired. Scaling of such a process to large areas (i.e. substrates greater than 15 cm in at least one dimension) is considerably easier than for point sources.

An elongated source for thermal physical vapor deposition of organic layers onto a structure for making an organic light-emitting device has been disclosed by Spahn in commonly assigned U.S. Pat. No. 6,237,529. The source disclosed by Spahn includes a housing, which defines an enclosure for receiving solid organic material, which can be vaporized. The housing is further defined by a top plate which defines a vapor efflux slit-aperture for permitting organic vapors to pass through the slit onto a surface of a structure spaced apart from the elongated source. The housing defining the enclosure is connected to the top plate. The source disclosed by Spahn further includes a conductive baffle member attached to the top plate. This baffle member provides line-of-sight covering of the slit in the top plate so that organic vapors can pass around the baffle member and through the slit onto the substrate or structure while particles of organic materials are prevented from passing through the slit by the baffle member when an electrical potential is applied to the housing to cause heat to be applied to the solid organic material in the enclosure causing the solid organic material to vaporize.

In using the thermal physical vapor deposition source disclosed by Spahn to form an organic layer of a selected organic material on a substrate or structure, it has been found that the vapor efflux slit-aperture causes non-uniform vapor flux of organic material to emanate along a length dimension of the slit. There is a problem when the width dimension of the slit is reduced, for example, to a width dimension less than 0.5 mm. Such spatially non-uniform orientation of opposing slit edges can be thought of as a deviation of planarity of opposing edges which, in turn, can promote a greater fraction of organic vapors to exit the vapor deposition source through a central portion of the slit, with a correspondingly lower fraction of organic vapors exiting the source through remaining portions of the slit along its length dimension. Such non-uniform vapor flux, directed at a substrate or structure, will cause the formation of an organic layer thereon which will have a non-uniform layer thickness in correspondence with the non-uniform vapor flux.

In addition, any nonuniformities in heat generation from the heater or heat absorption by the material to be deposited or distribution of the material within the source can give rise to nonuniformity in deposition along the length of the source. Yet another source of nonuniformity is unintended leaks in the source enclosure other than the apertures used to deliver the organic vapor. If such leak exists at the ends of the source, the flow of vapor from center to end of the source can cause pressure gradients within the source, thereby causing nonuniformity in the resultant deposition.

Forrest et al (U.S. Pat. No. 6,337,102B1) disclosed a method of vaporizing organic materials and organic precursors and delivering them to a reactor vessel wherein the substrate is situated and delivery of the vapors generated from solids or liquids is accomplished by use of carrier gases. In one embodiment of their invention, Forrest et al located the substrates within a suitably large reactor vessel, and the vapors carried thereto mix and react or condense on the substrate. Another embodiment of their invention is directed towards applications involving coating of large area substrates and putting several such deposition processes in serial fashion with one another. For this embodiment, Forrest et al disclosed the use of a gas curtain fed by a gas manifold (defined as "hollow tubes having a line of holes") in order to form a continuous line of depositing material perpendicular to the direction of substrate travel.

The approach to vapor delivery as disclosed by Forrest et al can be characterized as "remote vaporization" wherein a material is converted to vapor in an thermal physical deposition source external to the deposition zone and more likely external to the deposition chamber. Organic vapors alone or in combination with carrier gases are conveyed into the deposition chamber and ultimately to the substrate surface. Great care must be taken using this approach to avoid unwanted condensation in the delivery lines by use of appropriate heating methods. This problem becomes even more critical when contemplating the use of inorganic materials that vaporize to the desired extent at substantially higher temperatures. Furthermore, the delivery of the organic vapor for coating large areas uniformly requires the use of gas manifolds.

Each one, or a combination, of the aforementioned aspects of organic powders, flakes, or granules can lead to nonuniform heating of such organic materials in physical vapor deposition sources with attendant spatially non-uniform sublimation or vaporization of organic material and can, therefore, result in potentially non-uniform vapor-deposited organic layers formed on a structure.

SUMMARY OF THE INVENTION

It is an object of the present invention to provide a thermal physical vapor deposition source which is capable of coating thin uniform layer of organic material.

It is another object of the present invention to provide a thermal physical vapor source that is particularly suited for coating large areas.

It is another object of the present invention to make effective use of pellets of organic material that can be vaporized by the thermal physical vapor deposition source.

The above objects are achieved by a thermal physical vapor deposition source for vaporizing pellets containing organic materials onto a surface of a substrate in forming a display, comprising:

(a) a housing defining a plurality of spaced passages each for receiving compacted pellets of organic materials;

(b) a cover plate over the housing, with a first plurality of openings corresponding to the spaced passages of the housing;

(c) an electrical heater structure disposed over the cover plate;

(d) an aperture plate, disposed over the electrical heater structure and having at least one aperture;

(e) an electrically insulating spacer member located between the electrical heater structure and engaging the aperture plate, such electrically insulating spacer member having at least one opening, corresponding to the first plurality of openings of the cover plate and the spaced passages of the housing; and (f) means for applying current to the electrical heater structure to produce heat sufficient to vaporize the pellets and permit vapor efflux of materials to pass through the first plurality of openings of the cover plate, the heater structure, the electrically insulating spacer member and the apertures of the aperture plate, onto the substrate.

A feature of the present invention is the provision of the thermal physical vapor deposition source, which is designed to make use of compacted pellets of organic material that is capable of depositing thin layers to form a part of an OLED display.

Another feature of the present invention is that the thermal physical vapor deposition source is capable of depositing uniform organic layers which include at least one host component and at least one dopant component on a relatively large structure.

Yet, another beneficial feature of the present invention is that the compacted pellet of mixed organic materials can be evaporated for a longer time from a single thermal physical vapor deposition source rather than co-evaporation from a multiple deposition sources as in single component powders.

DETAILED DESCRIPTION OF THE INVENTION

The term "substrate" denotes at least a portion of an OLED display, which includes one or more layers onto which another organic layer is to be formed.

Figure 1:
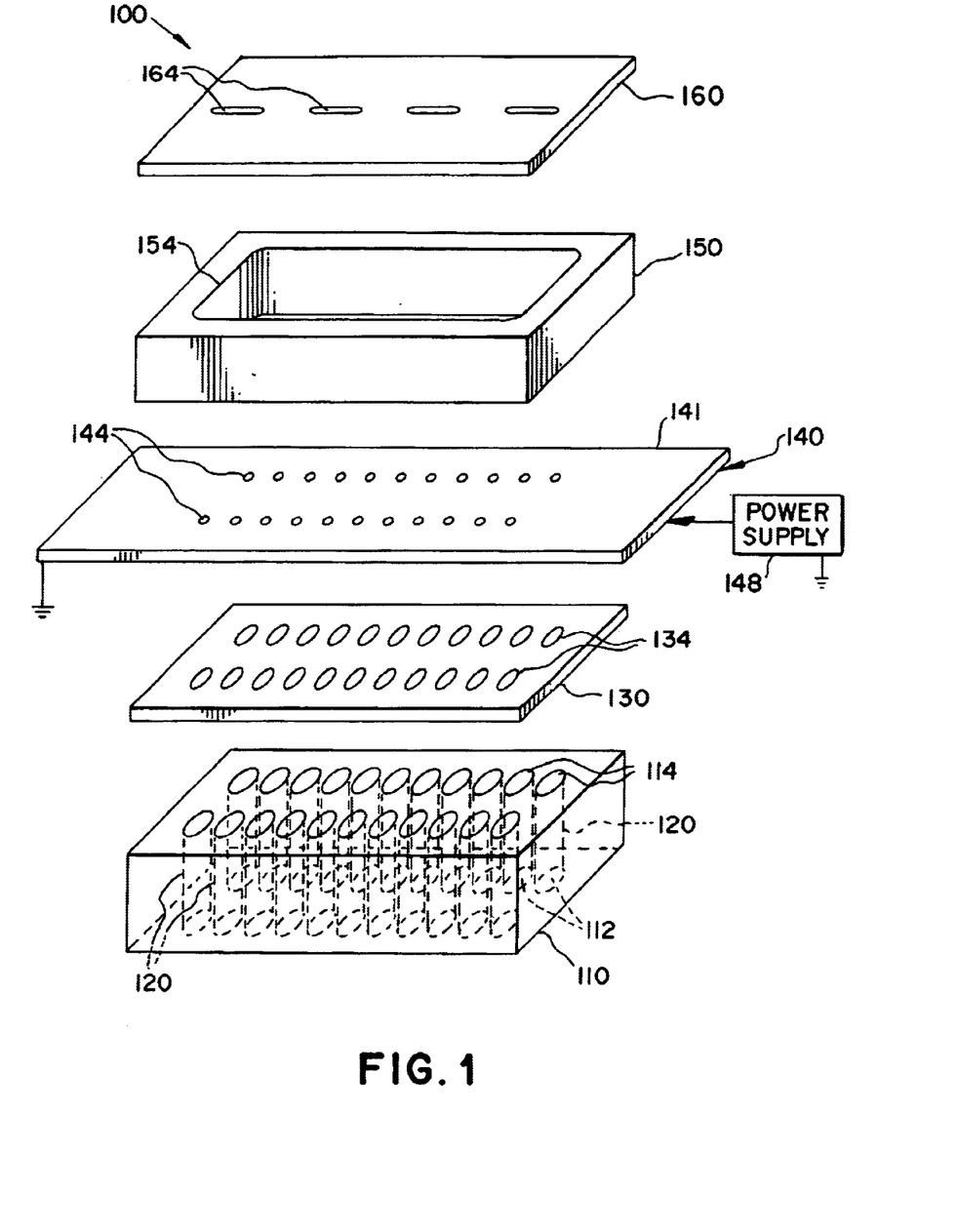
FIG. 1 is an exploded view of a thermal physical vapor deposition source in accordance with the present invention.

Turning to FIG. 1, a thermal physical deposition source 100 is illustrated, wherein a housing 110, defining a plurality of spaced passages 120, each spaced passage 120 having a closed first end 112 and an open second end 114 is shown. The spaced passages 120 can be of any shape and size and are fabricated such that compacted pellets 215 (see FIG. 2) of organic materials can be inserted through the open second end 114.

The housing 110 can be formed from thermally insulating materials such as high temperature glasses like quartz, alumino-boro-silicate glass and ceramics like alumina, zirconia, boron nitride, or magnesia. The purpose of using thermally insulating materials is to manage the thermal characteristics of the housing 110 when compacted pellets 215 used have more than one organic component, the details of which will be described hereinafter. Alternatively, if the thermal physical vapor deposition source 100 is used primarily for depositing organic layers from the compacted pellet 215 including a single component, the housing 110 can be made using thermally conductive materials such as stainless steel, tantalum, tungsten, or molybdenum. Further, the temperature of the housing 110 can be controlled using a variety of different methods, including controlling the temperature source (not shown), using integrated cooling or heating lines (not shown) to pass liquid or gaseous fluids through the housing 110 or integrating one or more heating elements (not shown) in the housing 110.

The thermal physical vapor deposition source 100 further includes a cover plate 130 disposed over the housing 110. The cover plate 130 defines a first plurality of openings 134, each opening 134 corresponding to one of the spaced passages 120 of the housing 110. The cover plate 130 can be made of electrically insulating materials such as alumina, high temperature glass like Pyrex®, silicon carbide or silicon nitride.

The thermal physical vapor deposition source 100 further includes an electrical heater structure 140. In this embodiment, the electrical heater structure 140 includes an electrically conductive heater plate 141 disposed over the cover plate 130. The electrical heater structure 140 can be either a single unit as shown in FIG. 1 or it can be a heating array 442 (see FIG. 4) of heating elements 443 (see FIG. 4). The heating elements 443 are driven by a DC power supply 148. The heater plate 141 includes a second plurality of openings 144, each one of the second plurality of openings 144 corresponds to each one of the first plurality of openings 134 of the cover plate 130.

The DC power supply 148 provides drive current through the heater plate 141. As current passes through the heater plate 141, thermal radiation is produced which is absorbed by the upper portions of the compacted pellets 215 causing vaporization of portions of the compacted pellets 215 in a vaporization zone 235 (see FIG. 2). Vaporization occurs in the vaporization zone 235, which is disposed between the heater plate 141 and the housing 110. The heater plate 141 can be made from electrically conductive materials, such as a metal or a conductive alloy. The conductive materials included in the heater plate 141 are selected to prevent condensation of the vaporized materials during operation of the thermal physical deposition source 100.

The thermal physical vapor deposition source 100 further includes an electrically insulating spacer member 150 disposed between the heater plate 141 and an aperture plate 160. The electrically insulating spacer member 150 has at least one opening 154, corresponding to the second plurality of openings 144 of the heater plate 141. The electrically insulating spacer member 150 is located between the aperture plate 160 and the heater plate 141 to electrically insulate the aperture plate 160 from the current passing through the heater plate 141. The electrically insulating spacer member 150 can be made from electrically insulating materials such as ceramic, glass and mica.

A mixing zone 255 (see FIG. 2) is disposed between the heater plate 141 and the aperture plate 160. The electrically insulating spacer member 150 can also include materials selected to remove any potential for internal vaporized material condensing on the spacer member 150.

Figure 2:
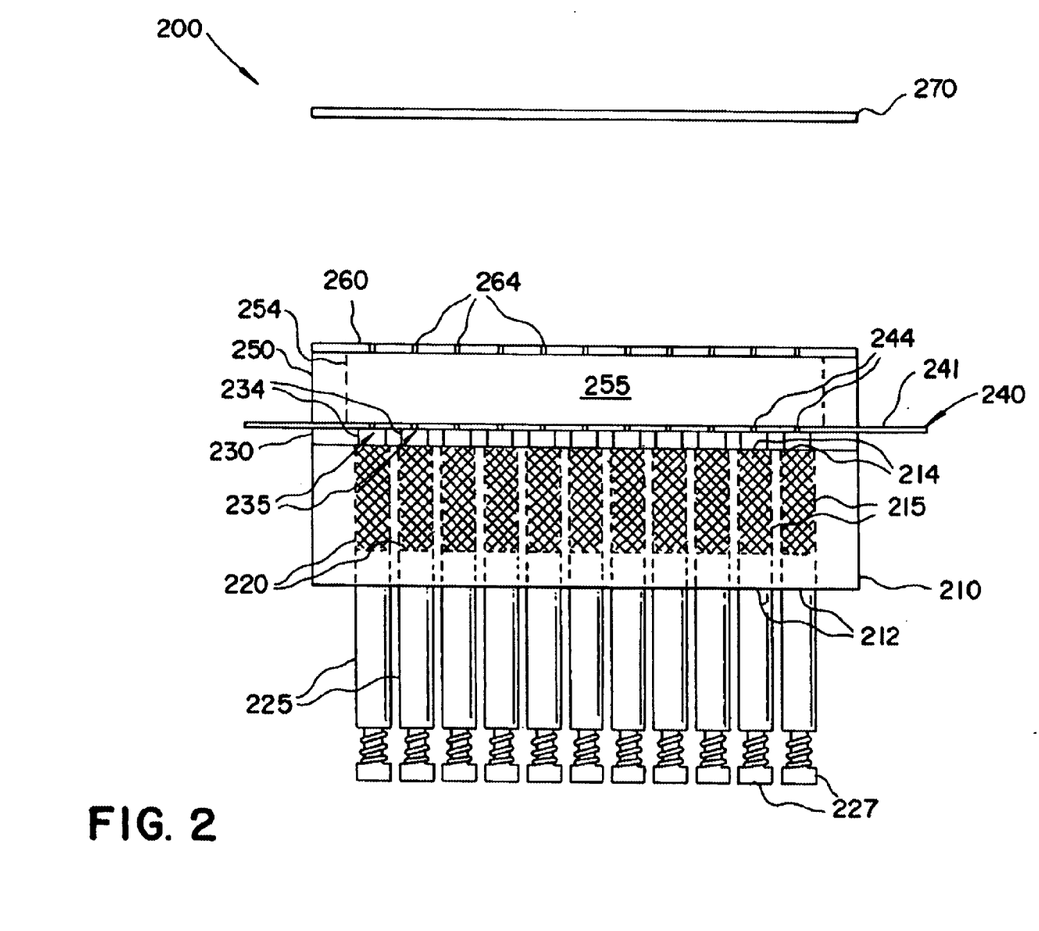
FIG. 2 is a cross-sectional view of the thermal physical vapor deposition source of FIG. 1.

The aperture plate 160 having at least one aperture 164 to permit vapors of organic materials to pass through the aperture plate 160 and deposit on a substrate 270 (see FIG. 2). The shape and number of the apertures 164 is selected to control the rate and pattern of vapor efflux and to promote sufficient deposition thickness uniformity on the substrate 270. The aperture plate 160 can include refractory metals like W, Ta or Mo or ceramics like alumina, zirconia, magnesia, or high temperature glass like quartz or Pyrex®.

When the power supply 148 drives current through the heater plate 141 sufficient heat is generated in the vaporization zone 235 to cause a portion of the compacted pellet 215 to vaporize. The vapor of organic material produced in the vaporization zone 235 sequentially passes through the first plurality of openings 134 in the cover plate 130, the second plurality of openings 144 in the heater plate 141, the electrically insulating spacer member 150 and the apertures 164 of the aperture plate 160. Further, additional heating elements may be placed on or near the cover plate 130, spacer member 150, and aperture plate 160 to prevent vaporous material from condensing on the cover plate 130, the spacer member 150, or the aperture plate 160.

Turning to FIG. 2, a cross-sectional view of another embodiment of a thermal physical deposition source 200 is shown. The compacted pellets 215 are placed in a plurality of spaced passages 220 of a housing 210 the details of which have been described hereinbefore (see FIG. 1). The spaced passages 220 can include multiple shapes, having an open first end 212 and an open second end 214 and each spaced passage 220 is adapted to receive the compacted pellet 215.

The spaced passages 220 are formed so that compacted pellets 215 can be inserted through the open second end 214 of the spaced passages 220. In this embodiment, a way of advancing the compacted pellets 215 so that the top portion of the compacted pellets 215 are in the vaporization zone 235 includes a plurality of push rods 225. The push rods 225 are insertable into the open first ends 212 of the spaced passages 220 and engage the compacted pellets 215 in the spaced passages 220 in order to adjust the position of the compacted pellets 215 to compensate for material loss during vaporization in the vaporization zone 235. The vaporization zone 235 is defined as the region between the housing 210 and the electrical heater structure 240.

The compacted pellets 215 are inserted into the spaced passages 220 and the push rods 225 are inserted into the open first ends 212 of the spaced passages 220 until the push rods 225 engage the compacted pellets 215. During vaporization of the compacted pellets 215 the top portion of the compacted pellet 215 is vaporized in the vaporization zone 235. The push rods 225 move the compacted pellets 215 through the spaced passages 220 and expose the compacted pellets 215 to the vaporization zone 235 until the pellets 215 are completely vaporized. To this end, the push rods 225 are engaged by a thumb screw assembly 227 which can be manually adjusted to change the position of the push rods.

Alternative embodiments can be used to position the push rods 225 including barreled screws, a common base connected to each of the push rods 225 being driven by a single screw, a hydraulic or pneumatic jack pushing all the push rods 225 at the same time, or an automatic or computer controlled system for operating the movement of the push rods 225.

The thermal physical vapor deposition source 200 further includes a cover plate 230 over the housing 210. The cover plate 230 defines a first plurality of openings 234, each opening 234 corresponding to each one of the spaced passages 220 of the housing 210. The cover plate 230 can be made of thermally conducting and electrically insulating materials such as alumina, high temperature glass like Pyrex®, silicon carbide or silicon nitride.

The thermal physical vapor deposition source 200 further includes an electrical heater structure 240. In this embodiment, the electrical heater structure 240 includes an electrically conductive heater plate 241 disposed over the cover plate 230. The heater plate 241 includes a second plurality of openings 244, wherein each one of the second plurality of openings 244 corresponding to each one of the first plurality of openings 234 of the cover plate 230.

A DC power supply 148 (see FIG. 1) provides a drive current through the heater plate 241. As current passes through the heater plate 241, thermal radiation is produced from the heater plate 241. The thermal radiation is absorbed by the upper portion of the compacted pellets 215 causing vaporization of the compacted pellets 215. The heater plate 241 can include electrically conductive materials, such as quartz bulbs, strip tantalum, cartridge heaters, and other metals. The materials of the heater plate 241 can be selected to prevent condensation of the vaporized materials during operation of the thermal physical deposition source 200.

The thermal physical vapor deposition source 200 further includes an electrically insulating spacer member 250 located over the heater plate 241 and an aperture plate 260 located over the electrically insulating spacer member 250. The electrically insulating spacer member 250 has at least one opening 254, corresponding to the second plurality of openings 244 of the heater plate 241 first plurality of openings 234 of the cover plate 230 and the spaced passages 220 of the housing 210. The electrically insulating spacer member 250 is located between the aperture plate 260 and the heater plate 241 to electrically insulate the aperture plate 260 from the current passing through the heater plate 241. The electrically insulating spacer member 250 can be made of electrically insulating materials such as ceramic, glass and mica.

The mixing zone 255 is disposed between the heater plate 241 and the aperture plate 260. The electrically insulating spacer member 250 can include materials selected to remove any potential for internal vaporized material condensing on the spacer member 250.

The aperture plate 260 having at least one aperture 264 to permit vapors of organic materials to pass through the aperture plate 260 and deposit on the substrate 270. The shape and number of the apertures 264 is selected to control the rate and pattern of vapor efflux and promote sufficient deposition thickness uniformity on the substrate 270.

In this embodiment, the compacted pellets 215 made of organic material are vaporized in the vaporization zone 235. The vapor of organic material passes sequentially through the first plurality of openings 234 in the cover plate 230, the second plurality of openings 244 in the heater plate 241, the electrically insulating spacer member 250 and the apertures 264 of the aperture plate 260. The aperture plate 260 can include refractory metals like W, Ta or Mo or ceramics like alumina, zirconia, magnesia, or high temperature glass like quartz or Pyrex®. The materials of the aperture plate 260 can be selected to prevent condensation of vaporized material during vaporization of the compacted pellets 215. Further, additional heating elements may be placed on or near the cover plate 230, electrically insulating spacer member 250, and aperture plate 260 to prevent vaporous material from condensing on the cover plate 230, the spacer member 250, or the aperture plate 260.

Figure 3:
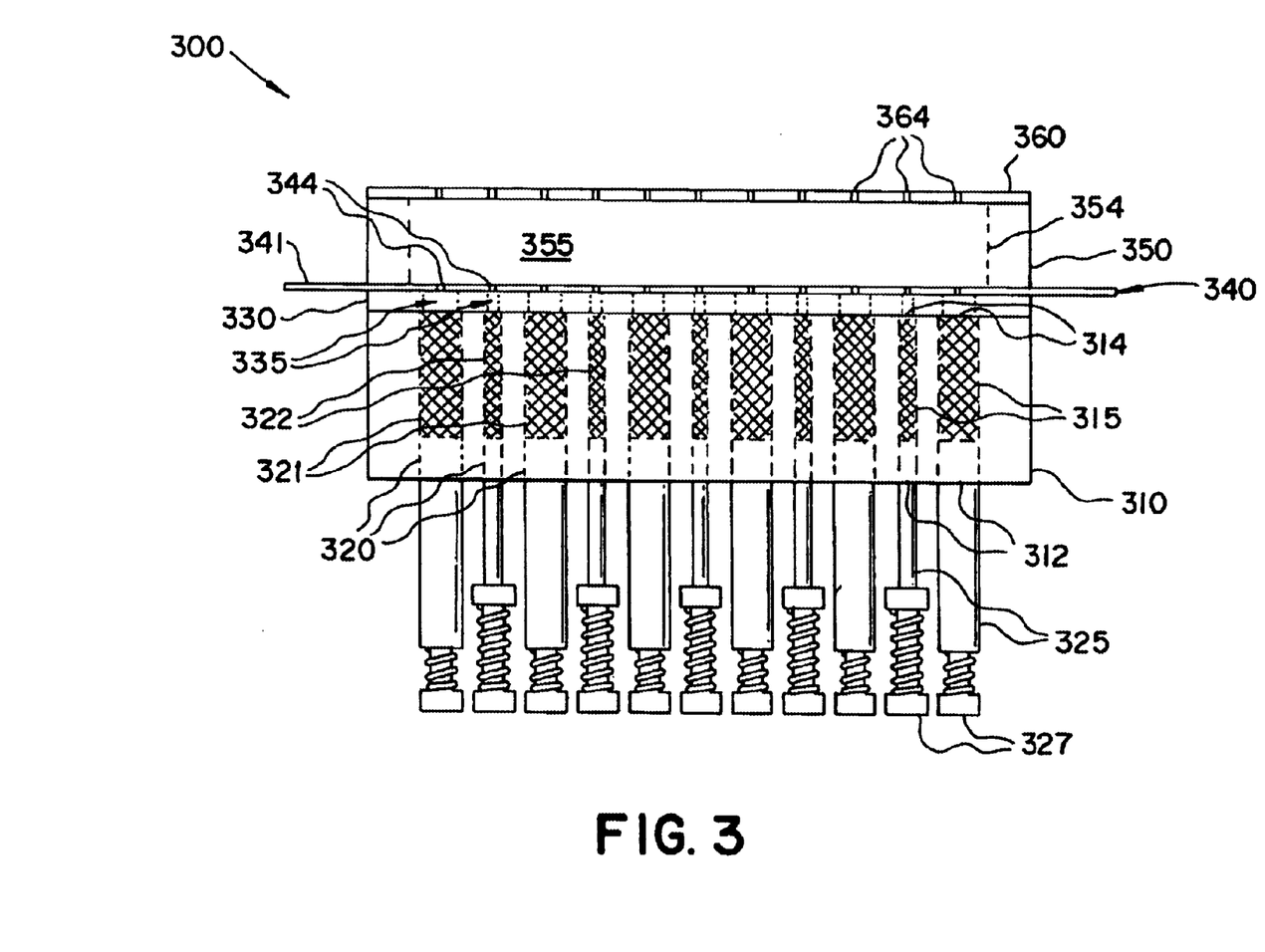
FIG. 3 is cross-sectional view of another embodiment of a thermal physical vapor deposition source.

Turning to FIG. 3, another embodiment of a thermal physical deposition source 300 is illustrated, wherein compacted pellets 315 are placed in a plurality of spaced passages 320 of a housing 310. The spaced passages 320 can include multiple shapes and have an open first end 312 and an open second end 314 and are adapted to receive the compacted pellets 315.

In this embodiment, the spaced passages 320 include both large cross-sectional area spaced passages 321 and small cross-sectional area spaced passages 322 to receive the compacted pellets 315 of different sizes and different compositions. For example, pellets including a host organic material can be contained in the large cross-sectional area spaced passages 321 and pellets including a dopant organic material can be contained in the small cross-sectional area spaced passages 322 to support the deposition of multi-component thin films. Such host and dopant organic materials will mix upon vaporization and be deposited on a substrate in the proportions controlled by the cross-sectional area of the spaced passages 320 and the rate of vaporization.

The housing 310 can be made of thermally and electrically insulating or conductive materials such as graphite, quartz, tantalum, ceramics, and metals. Further, the temperature of the housing 310 can be controlled using a variety of different methods, including controlling the temperature source (not shown), using integrated cooling or heating lines (not shown) to pass liquid or gaseous fluids through the housing 310 or integrating one or more heating elements (not shown) in the housing 310.

The spaced passages 320 are formed so that compacted pellets 315 can be inserted into the open second ends 314 of the spaced passages 320. In this embodiment, a way of advancing the pellets so that the top portion of the compacted pellets 315 are in the vaporization zone 335 includes a plurality of push rods 325. The push rods 325 are insertable into the open first ends 312 of the spaced passages 320 and engage the pellets 315 in the spaced passages 320 in order to adjust the position of the pellets 315 to compensate for material loss during vaporization in the vaporization zone 335. The vaporization zone 335 is defined as the region between the housing 310 and the electrical heater structure 340.

The compacted pellets 315 are inserted into the spaced passages 320 and the push rods 325 are inserted into the open first ends 312 of the spaced passages 320 until the push rods 325 engage the compacted pellets 315. During vaporization of the compacted pellets 315 the top portion of the pellets 315 are vaporized in the vaporization zone 335. The push rods 325 move the compacted pellets 315 through the spaced passages 320 and expose the compacted pellets 315 to the vaporization zone 335 until the pellets 315 are completely vaporized. To this end, the push rods 325 are engaged by a thumb screw assembly 327, which can be manually adjusted to change the position of the push rods 325.

Alternative embodiments can be used to position the push rods 325 including barreled screws, a common base connected to each of the push rods 325 being driven by a single screw, a hydraulic or pneumatic jack pushing all the push rods 325 at the same time, or an automatic or computer controlled system for operating the movement of the push rods 325.

The thermal physical vapor deposition source 300 further includes a cover plate 330 over the housing 320. The cover plate 330 includes a first plurality of openings 334, each one of the first plurality of openings 334, corresponding to each one of the spaced passages 320 of the housing 310. The cover plate 330 can include thermally conducting and electrically insulating materials such as alumina, high temperature glass like Pyrex®, silicon carbide or silicon nitride.

The thermal physical vapor deposition source 300 further includes an electrical heater structure 340. In this embodiment, the electrical heater structure 340 includes an electrically conductive heater plate 341 disposed over the cover plate 330. The heater plate 341 includes a second plurality of openings 344, each one of the second plurality of openings 344 corresponding to the first plurality of openings 334 of the cover plate 330.

A DC power supply 148 (see FIG. 1) provides drive current through the heater plate 341. As current passes through the heater plate 341, thermal radiation is produced from the heater plate 341. The thermal radiation is absorbed by the upper portion of the compacted pellets 315 causing vaporization of the compacted pellets 315. The heater plate 341 can include electrically conductive materials, such as quartz bulbs, strip tantalum, cartridge heaters, and other metals. The materials of the heater plate 341 can be selected to prevent condensation of the vaporized materials during operation of the thermal physical deposition source 300.

The thermal physical vapor deposition source 300 further includes an electrically insulating spacer member 350 located over the heater plate 341 and an aperture plate 360 located over the electrically insulating spacer member 350. The electrically insulating spacer member 350 has at least one opening 354, corresponding to the second plurality of openings 344 of the heater plate 341, first plurality of openings 334 of the cover plate 330 and the spaced passages 320 of the housing 310. The electrically insulating spacer member 350 is located between the aperture plate 360 and the electrical heater structure 340 to electrically insulate the aperture plate 360 from the current passing through the heater plate 341. The electrically insulating spacer member 350 can be made from electrically insulating materials such as ceramic, glass and mica.

The mixing zone 355 is disposed between the heater plate 341 and the aperture plate 360. The electrically insulating spacer member 350 can also include materials selected to remove any potential for internal vaporized material condensing on the spacer member 350.

The aperture plate 360 includes at least one aperture 364 to permit vapors of organic materials to pass through the aperture plate 360 and deposit on the substrate 270 (see FIG. 2). The shape and number of the apertures 364 is selected to control the rate and pattern of vapor efflux and promote sufficient deposition thickness uniformity on the substrate 270.

In this embodiment, compacted pellets 315 made of organic material are vaporized in the vaporization zone 335. The vapor of organic material passes sequentially through the first plurality of openings 334 in the cover plate 330, the second plurality of openings 344 in the heater plate 341, the electrically insulating spacer member 350 and the apertures 364 of the aperture plate 360. The aperture plate 360 can include refractory metals like W, Ta or Mo or ceramics like alumina, zirconia, magnesia, or high temperature glass like quartz or Pyrex®. The materials of the aperture plate 360 can be selected to prevent condensation of vaporized materials during the vaporization of the compacted pellets 315. Further, additional heating elements may be placed on or near the cover plate 330, spacer member 350, and aperture plate 360 to prevent vaporous material from condensing on the cover plate 330, the electrically insulating spacer member 350, or the aperture plate 360.

Figure 4:
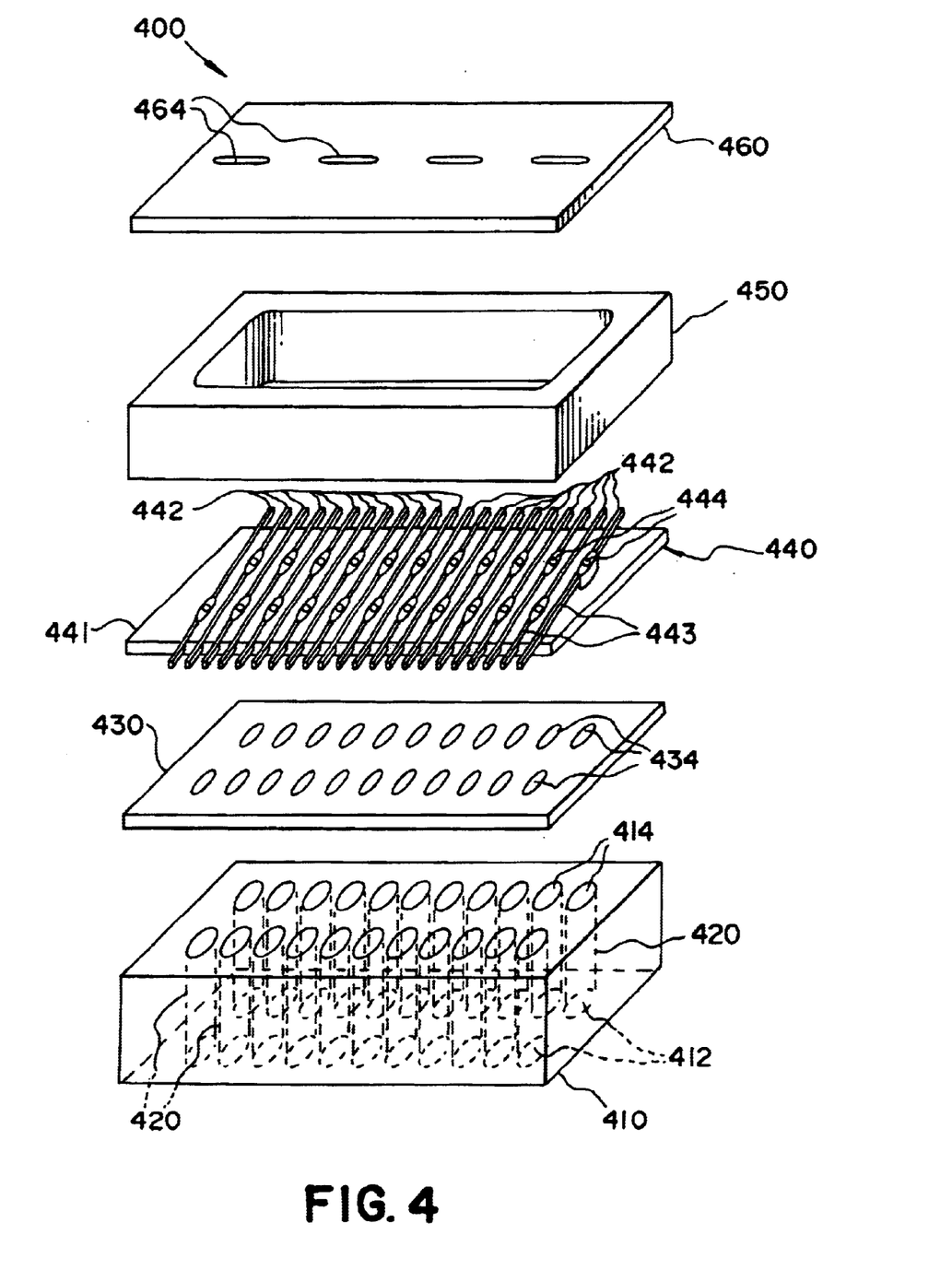
FIG. 4 is an exploded view of a thermal physical vapor deposition source having a different electrical heater structure.

Turning to FIG. 4, another embodiment of a thermal physical vapor deposition source 400 is illustrated, wherein the compacted pellets 215 (FIG. 2) are placed in a plurality of spaced passages 420 of a housing 410. The spaced passages 420 can include multiple shapes and sizes and have an open first end 412 and an open second end 414 and are adapted to receive the compacted pellet 215. The housing 410 can include thermally and electrically insulating materials such as quartz, tantalum, ceramics, and glass-ceramics.

The spaced passages 420 are formed so that compacted pellets 215 can be inserted into the open second ends 414 of the spaced passages 420. In this embodiment, a way of advancing the compacted pellets 215 so that the top portion of the compacted pellets 215 are in the vaporization zone 235 includes the push rods 225 as described hereinbefore. The push rods 225 are insertable into the open first ends 412 of the spaced passages 420 and engage the compacted pellets 215 in the spaced passages 420 in order to adjust the position of the compacted pellets 215 to compensate for material loss during vaporization in the vaporization zone 235. The vaporization zone 235 is defined as the region between the housing 410 and the electrical heater structure 440.

The compacted pellets 215 are inserted into the spaced passages 420 and the push rods 225 are inserted into the open first end 412 of the spaced passages 420 until the push rods 225 engage the compacted pellets 215. During vaporization of the compacted pellets 215 the top portion of the pellet 215 is vaporized in the vaporization zone 235. The push rods 225 move the compacted pellets 215 through the spaced passages 420 and expose the compacted pellets 215 to the vaporization zone 235 until the pellets 215 are completely vaporized. To this end, the push rods 225 are engaged by a thumb screw assembly 227, which can be manually adjusted to change the position of the push rod.

Alternative embodiments can be used to position the push rods 225 including barreled screws, a common base connected to all the push rods 225 being driven by a single screw, a hydraulic or pneumatic jack pushing all the push rods 225 at the same time, or an automatic or computer controlled system for operating the movement of the push rods 225.

The thermal physical vapor deposition source 400 further includes a cover plate 430 over the housing 410. The cover plate 430 includes a first plurality of openings 434, each one of the first plurality of openings 434 corresponding to the each one of the spaced passages 420 of the housing 410. The cover plate 430 can include thermally conducting and electrically insulating materials such as alumina, high temperature glass like Pyrex®, silicon carbide or silicon nitride. The materials of the cover plate 430 can be selected to prevent condensation of vaporized materials onto the surface of the cover plate 430 during vaporization of the compacted pellets 215.

The thermal physical vapor deposition source 400 further includes an electrical heater structure 440. In this embodiment, the electrical heater structure 440 includes a heater plate 441 disposed over the cover plate, having a second plurality of openings 444 corresponding to the first plurality of openings 434 of the cover plate 430 and the spaced passages 420 of the housing 410. The electrical heater structure 440 further includes a heating array 442, which includes a plurality of heating elements 443 over the heater plate 441, each such heating element 443 corresponding to each opening in the heater plate 441.

A DC power supply 148 (see FIG. 1) provides a drive current through the heating elements 443. As current passes through the heating elements 443, thermal radiation is produced from the heating elements 443 proportional to the current applied to the individual heating element 443. The thermal radiation is absorbed by the portion of the compacted pellets 215 in the vaporization zone causing vaporization of the compacted pellets 215. The heating elements 443 in the heating array 442 and the heater plate 441 include quartz bulbs, strip tantalum, cartridge heaters, and other metals. The materials of the electrical heater structure 440 can be selected to prevent condensation of the vaporized materials during operation of the thermal physical deposition source 400.

The advantages of using the individually-controlled heating elements 443, include producing varying radiation profiles thereby controlling temperature gradients in the heater structure and resulting in better control in the rate of vaporization of individual compacted pellets 215. Combining the embodiment of FIG. 4 with the embodiment of FIG. 3 can produce improved controlled deposition by improved control of internal mixing behavior and improved control of the vapor composition deposited on the substrate 270.

The thermal physical vapor deposition source 400 further includes an electrically insulating spacer member 450 located over the electrical heater structure 440 and an aperture plate 460 located over the electrically insulating spacer member 450. The electrically insulating spacer member 450 has at least one opening 454, corresponding to the second plurality of openings 444 of the electrical heater structure 440, first plurality of openings 434 of the cover plate 430 and the spaced passages 420 of the housing 410. The electrically insulating spacer member 450 is located between the aperture plate 460 and the electrical heater structure 440 to electrically insulate the aperture plate 460 from the electrical potential and resulting current passed through the electrical heater structure 440. The electrically insulating spacer member 450 can be made from electrically insulating materials such as ceramic, glass and mica.

The mixing zone 255 is disposed between the heater plate 441 and the aperture plate 460. The electrically insulating spacer member 450 can also include materials selected to remove any potential for internal vaporized material condensing on the spacer member 450.

The aperture plate 460 includes at least one aperture 464 to permit vapors of organic materials to pass through the aperture plate 460 and deposit on a substrate 270. The shape and number of the apertures 464 is selected to control the rate and pattern of vapor efflux and promote deposition thickness uniformity on the substrate 270.

In this embodiment, the compacted pellets 215 made of organic material are vaporized in the vaporization zone 235. The vapor of organic material passes sequentially through the first plurality of openings 434 in the cover plate 430, the second plurality of openings 444 in the heater plate 441, the electrically insulating spacer member 450 and the apertures 464 of the aperture plate 460. The aperture plate 460 can include refractory metals like W, Ta or Mo or ceramics like alumina, zirconia, magnesia, or high temperature glass like quartz or Pyrex®. The materials of the aperture plate 460 can be selected to prevent condensation of vaporized materials during the vaporization of the compacted pellets 215. Further, additional heating elements may be placed on or near the cover plate 430, spacer member 450, and aperture plate 460 to prevent vaporous material from condensing on the cover plate 430, the spacer member 450, or the aperture plate 460.

The invention has been described in detail with particular reference to certain preferred embodiments thereof, but it will be understood that variations and modifications can be effected within the spirit and scope of the invention.

PARTS LIST 100 thermal physical vapor deposition source
110 housing
112 closed first end
114 open second end
120 spaced passages
130 cover plate
134 first plurality of openings
140 electrical heater structure
141 heater plate
144 second plurality of openings
148 power supply
150 electrically insulating spacer member
154 opening
160 aperture plate
164 aperture(s)
200 thermal physical vapor deposition source
210 housing
212 open first end
214 open second end
215 compacted pellets
220 spaced passages
225 push rods
227 thumb screw assembly
230 cover plate
234 first plurality of openings
235 vaporization zone
240 electrical heater structure
241 heater plate
244 second plurality of openings
250 electrically insulating spacer member
254 opening
255 mixing zone
260 aperture plate
264 aperture(s)
270 substrate
300 thermal physical vapor deposition source
310 housing
312 open first end
314 open second end
315 compacted pellets
320 spaced passages
321 large cross-sectional area spaced passages
322 small cross-sectional area spaced passages
325 push rods
327 thumb screw assembly
330 cover plate
334 first plurality of openings
335 vaporization zone
340 electrical heater structure 341 heater plate
344 second plurality of openings
350 electrically insulating spacer member
354 opening
355 mixing zone
360 aperture plate
364 aperture(s)
400 thermal physical vapor deposition source
410 housing
412 open first end
414 open second end
420 spaced passages
430 cover plate
434 first plurality of openings
440 electrical heater structure
441 heater plate
442 heating array
443 heating elements
444 second plurality of openings
450 electrically insulating spacer member
454 opening
460 aperture plate
464 aperture(s)

What is claimed is:

1. A thermal physical vapor deposition source for vaporizing pellets containing organic materials onto a surface of a substrate in forming a display, comprising:
   (a) a housing defining a plurality of spaced passages each for receiving compacted pellets of organic materials;
   (b) a cover plate over the housing, with a first plurality of openings corresponding to the spaced passages of the housing;
   (c) an electrical heater structure disposed over the cover plate;
   (d) an aperture plate, disposed over the electrical heater structure and having at least one aperture;
   (e) an electrically insulating spacer member located between the electrical heater structure and engaging the aperture plate, such electrically insulating spacer member having at least one opening, corresponding to the first plurality of openings of the cover plate and the spaced passages of the housing; and
   (f) means for applying current to the electrical heater structure to produce heat sufficient to vaporize the pellets and permit vapor efflux of materials to pass through the first plurality of openings of the cover plate, the heater structure, the electrically insulating spacer member and the apertures of the aperture plate, onto the substrate.

2. The thermal physical vapor deposition source of claim 1, wherein the housing includes thermally insulating material.

3. The thermal physical vapor deposition source of claim 1, wherein the electrical heater structure includes an electrically conductive heater plate over the cover plate, such heater plate having a second plurality of openings, each opening of the heater plate corresponding to a first plurality opening of the cover plate and corresponding to a spaced passage of the housing.

4. The thermal physical vapor deposition source of claim 1, wherein the cover plate includes electrically insulating material.

5. The thermal physical vapor deposition source of claim 1, wherein the electrically insulating spacer member includes electrically insulating material.

6. The thermal physical vapor deposition source of claim 1, wherein the aperture plate includes electrically insulated material and is electrically insulated from the conductive heater plate by the electrically insulating spacer member.

7. The thermal physical vapor deposition source of claim 1, wherein different cross-sectional areas of the apertures of the aperture plate are selected to form different flow rates and patterns of vapor efflux.

8. The thermal physical vapor deposition source of claim 1, wherein the heater structure includes one or more heating elements.

9. The thermal physical vapor deposition source of claim 1, further includes a mixing zone defined between the electrical heater structure and the aperture plate.

10. The thermal physical vapor deposition source of claim 1, wherein the electrical heater structure includes a heating array with a plurality of heating elements.

11. The thermal physical vapor deposition source of claim 1 further including means engageable with pellets in the spaced passages for adjusting the position of the pellets to compensate for material loss during vaporization.

12. A thermal physical vapor deposition source for vaporizing pellets containing organic materials onto a surface of a substrate in forming a display, comprising:
   (a) a housing, defining a plurality of spaced passages, each such passage having an open first end and an open second end and being adapted to receive a pellet;
   (b) a cover plate, over the housing, with a first plurality of openings, corresponding to the spaced passages of the housing;
   (c) an electrical heater structure over the cover plate;
   (d) a vaporization zone defined between the housing and the electrical heater structure;
   (e) push rods, each being insertable into the open first end of one of the spaced passages for engaging a pellet in the passage and moving the pellet into the vaporization zone;
   (f) means for moving the push rods for engaging the pellets, to move the top portion of each pellet into the vaporization zone;
   (g) an aperture plate, having at least one aperture;
   (h) an electrically insulating spacer member located between the electrical heater structure and engaging the aperture plate, such electrically insulating spacer member having at least one opening, corresponding to the first plurality of openings in the cover plate and the spaced passages of the housing; and
   (i) means for applying current to the electrical heater structure sufficient to vaporize the pellets and permit vapor efflux of the materials to pass through the first plurality of openings in the cover plate, the electrical heater structure, the electrically insulating spacer member and the apertures of the aperture plate, onto the substrate.

13. The thermal physical vapor deposition source of claim 12, wherein the housing includes thermally insulating material.

14. The thermal physical vapor deposition source of claim 12, wherein the cover plate includes electrically insulating material.

15. The thermal physical vapor deposition source of claim 12, wherein the electrical heater structure includes an electrically conductive heater plate, over the cover plate, having a second plurality of openings, each of the openings corresponding to each of the first plurality of openings of the cover plate and the spaced passages of the housing.

16. The thermal physical vapor deposition source of claim 12, wherein the spacer member includes electrically insulating material.

17. The thermal physical vapor deposition source of claim 12, wherein the aperture plate includes electrically insulated material and is electrically insulated from the conducting plate by the spacer member.

18. The thermal physical vapor deposition source of claim 12, wherein the apertures of the aperture plate are selected to have different cross-sectional areas to produce different flow rates and patterns of vapor efflux.

19. The thermal physical vapor deposition source of claim 12, wherein the electrical heater structure includes a heating array with a plurality of heating elements.

20. The thermal physical vapor deposition source of claim 12, further includes a mixing zone defined between the electrical heater structure and the aperture plate.

21. The thermal physical vapor deposition source of claim 12 wherein the means for moving the push rods for engaging the pellets includes barreled screws, a common base connected to all the push rods driven by a single screw, a hydraulic or pneumatic jack engaging the push rods at the same time, or an automatic or computer controlled system for operating the movement of the push rods.

22. A thermal physical vapor deposition source for vaporizing pellets containing organic materials onto a surface of a substrate in forming a display, comprising:

(a) a housing, defining a plurality of spaced passages, each such spaced passage having an open first end and an open second end and being adapted to receive a pellet;

(b) a cover plate, over the housing, with a first plurality of openings, corresponding to the spaced passages of the housing;

(c) an electrical heater structure including an electrically conductive heater plate, disposed over the cover plate, with a second plurality of openings corresponding to the first plurality of openings of the cover plate and a heating array including a plurality of heating elements, each such heating element corresponding to each opening in the conductive heater plate;

(d) a vaporization zone defined between the housing and the electrical heater structure;

(e) push rods, each being insertable into the open first end of one of the spaced passages for engaging a pellet and moving the pellet into the vaporization zone;

(f) an electrically insulating spacer member over the electrical heater structure with at least one opening, corresponding to the first plurality of openings in the cover plate and the spaced passages of the housing;

(g) an aperture plate, over the insulating plate, having at least one aperture;

(h) a mixing zone defined between the electrical heater structure and the aperture plate; and (i) means for applying current to the heating array including the plurality of heating elements, thereby controlling temperature gradients in the electrical heater structure to vaporize the pellets and permit vapor efflux of materials to pass through the first plurality of openings in the cover plate, the second plurality of openings in the electrical heater structure, the electrically insulating spacer member and the apertures of the aperture plate, onto the substrate.

23. A thermal physical vapor deposition source for vaporizing a plurality of pellets containing organic materials onto a surface of a substrate in forming a display, comprising:

(a) a housing, defining a plurality of spaced passages wherein certain passages receive compacted pellets of host organic material and others receive dopant organic material;

(b) a cover plate over the housing, with a first plurality of openings corresponding to the spaced passages of the housing;

(c) an electrical heater structure, disposed over the cover plate;

(d) an aperture plate, disposed over the electrical heater structure and having at least one aperture;

(e) an electrically insulating spacer member located between the electrical heater structure and engaging the aperture plate, such electrically insulating spacer member having at least one opening, corresponding to the first plurality of openings of the cover plate and the spaced passages of the housing; and (f) means for applying current to the electrical heater structure to produce heat sufficient to vaporize the pellets and permit vapor efflux of materials to pass through the first plurality of openings of the cover plate, the heater structure, the electrically insulating spacer member and the apertures of the aperture plate, onto the substrate.

* * * * *